(12) United States Patent
Jones et al.

(10) Patent No.: US 8,361,540 B2
(45) Date of Patent: Jan. 29, 2013

(54) RANDOMIZED CIRCULAR GRIDS FOR LOW-SCATTER EM SHIELDING OF A SENSOR WINDOW

(75) Inventors: Michael I. Jones, Fort Worth, TX (US); Leslie D. Hines, Fort Worth, TX (US)

(73) Assignee: Lockheed Martin Corporation, Bethesda, MD (US)

(*) Notice: Subject to any disclaimer, the term of this patent is extended or adjusted under 35 U.S.C. 154(b) by 255 days.

(21) Appl. No.: 12/654,315

(22) Filed: Dec. 16, 2009

(65) Prior Publication Data

US 2010/0180428 A1 Jul. 22, 2010

Related U.S. Application Data

(60) Provisional application No. 61/138,010, filed on Dec. 16, 2008.

(51) Int. Cl.
*B05D 5/12* (2006.01)
(52) U.S. Cl. ...... 427/96.2; 427/97.1; 428/209; 29/592.1
(58) Field of Classification Search .................. 428/156, 428/172, 209–210, 426, 430–433, 500, 913; 174/390; 359/893–896; 29/592.1, 840
See application file for complete search history.

(56) References Cited

U.S. PATENT DOCUMENTS

| | | | | |
|---|---|---|---|---|
| 4,772,760 A * | 9/1988 | Graham | | 174/389 |
| 4,932,755 A * | 6/1990 | Holdridge et al. | | 359/896 |
| 5,017,419 A * | 5/1991 | Smith | | 428/209 |
| 5,084,132 A * | 1/1992 | Smith | | 216/39 |
| 5,649,754 A * | 7/1997 | Matsumoto | | 362/618 |
| 5,945,213 A * | 8/1999 | Nagaike et al. | | 428/336 |
| 6,028,699 A * | 2/2000 | Fisher | | 359/360 |
| 6,712,481 B2 * | 3/2004 | Parker et al. | | 362/619 |
| 7,712,932 B2 * | 5/2010 | Parker et al. | | 362/337 |

* cited by examiner

*Primary Examiner* — Minh Trinh
(74) *Attorney, Agent, or Firm* — Birch, Stewart, Kolasch & Birch, LLP (57) ABSTRACT

A randomized elliptical grid disposed on a sensor window for electro-magnetic and/or radio-frequency shielding of sensors, and a method of applying same. Grids may be made of electrically conductive or resistive material and may include elliptical or circular shapes. The shapes are in physical contact with each-other and preferably do not contain straight lines to reduce detection artifacts caused by the coating. Grid element shape, size, orientation, and grid pattern density may be randomized or varied across a sensor window.

17 Claims, 7 Drawing Sheets

RANDOMIZED CIRCULAR GRIDS FOR LOW-SCATTER EM SHIELDING OF A SENSOR WINDOW

PRIORITY

The present Application claims benefit of priority from Provisional Application 61/138,010, which was filed with the United States Patent and Trademark Office on Dec. 16, 2008.

TECHNICAL FIELD OF THE INVENTION

The present invention relates to optical and infra-red sensor equipment. Specifically, the present invention relates to metallized coatings for sensor windows to allow for effective transmission of optical and infra-red radiation while providing good electro-magnetic shielding.

BACKGROUND

Untreated optical-quality windows for optical and infrared sensors and for laser transmit/receive systems are often electrically clear, having no exterior surface conductivity and therefore unable to shield sensitive internal components from electromagnetic interference (EMI) or electromagnetic pulses (EMP). A conductive surface coating applied to a sensor window may be used to pass optical energy while blocking EMI/EMP energy, by conducting it directly to the surrounding window frame. Such a conductive coating is typically made of metal or metallic film. Continuous metal films have reasonably good visible-light transmission, but have poor to zero infrared transmission. Therefore, the metallized windows may meet EMI/EMP requirements, but cannot meet broadband optical/infrared transmission requirements.

Conventionally known solutions widely used in the aircraft and electromagnetic industry involve the application of straight-line wire meshes or photolithographic grids to the optical window glass. The open spaces between the wires or grid lines do not affect the passage of visible light and infra-red energy through the sensor window, while the wires or grid lines, which are thermally and visually opaque, conduct the majority of EMI/EMP RF energy away to the window frame. These straight-line meshes and grids provide adequate EMI/EMP shielding, but the grid and wire patterns they employ generate significant scattering and diffraction of transmitted optical and IR energy. These traditional approaches also had problems when operated away from normal incidence angles, as light transmission dropped and optical scattering increased rapidly with increasing incidence angle.

In searching for improvements to the above-stated problems, Lockheed Martin developed a new form of conductive pattern termed "hub-spoke" in the early 1990's that was a hybrid of very small metallic film circles, deposited 1 to 2 microns thick, with 10 micron widths and 200-300 micron circle diameters, with straight-line interconnectors. This Lockheed Martin-originated pattern was implemented at Battelle Laboratories, Columbus Ohio, and has been widely applied to a number of military platforms. The center positions for each of the circles (termed "hubs") was slightly randomized, and the circles did not overlap, but were instead electrically connected with very short straight-line segments, termed "spokes", having angles that were randomized as well. This new grid pattern greatly reduced optical scattering and diffraction relative to earlier straight-line meshes and grids, while providing the equivalent EMI/EMP shielding.

The hub-spoke arrangement, however, was still subject to particular diffraction effects associated with grid-like structures. Specifically, the hub-spoke pattern contained many straight-line segments and had a relatively regular pattern. Off-normal operation, even with this pattern, continued to produce significant drops in light transmission and increases in scattering. Despite having a less regular and less angular arrangement, the hub-spoke pattern still contained many of the disadvantages of predecessor grids, albeit to a lesser degree.

INVENTION SUMMARY

The hub-spoke conductive pattern was the first step away from traditional straight-line wire meshes and grids toward reduced-scattering conductive grids. It was later determined that the spokes, first believed to be necessary to provide electrical continuity between all circles, remained a source of excessive optical scattering and diffraction, even if their angular orientation was totally randomized. It was also first believed that the hubs should be spatially separated and not overlapping, but instead connected with the straight-line spokes. This too was later proven to be overly constraining. Only overlapping ellipses (and/or circles, which are merely ellipses whose major and minor axes are of equal length) were required to provide the necessary EMI/EMP shielding, while generating significantly less diffraction scattering.

The present invention eliminates the spokes and allows the circles and/or ellipses to overlap. Elimination of the spokes eliminates all sources of −13 dB side lobe scattering characteristic of straight-line diffraction. Overlap of the ellipses and circles may be accomplished by uniformly randomizing the positions of the ellipse centers over the window aperture. In some embodiments, the diameters of the circles, the ratio of minor to major axes for the ellipses, and the orientation of the ellipse major axes, may be randomized as well. This new form of conductive pattern, composed of overlapping ellipses, is generally termed the Randomized Circular Grid, or RCG. Advantages of the inventive pattern include improved overall infra-red transmission and significant reductions in both optical and infra-red diffraction across all incidence angles through the elimination of straight edges from the metallized coating of the sensor window.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given herein below and the accompanying drawings which are given by way of illustration only, and thus are not limitative of the present invention, and wherein.

The drawings will be described in detail in the course of the detailed description of the invention.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1A:
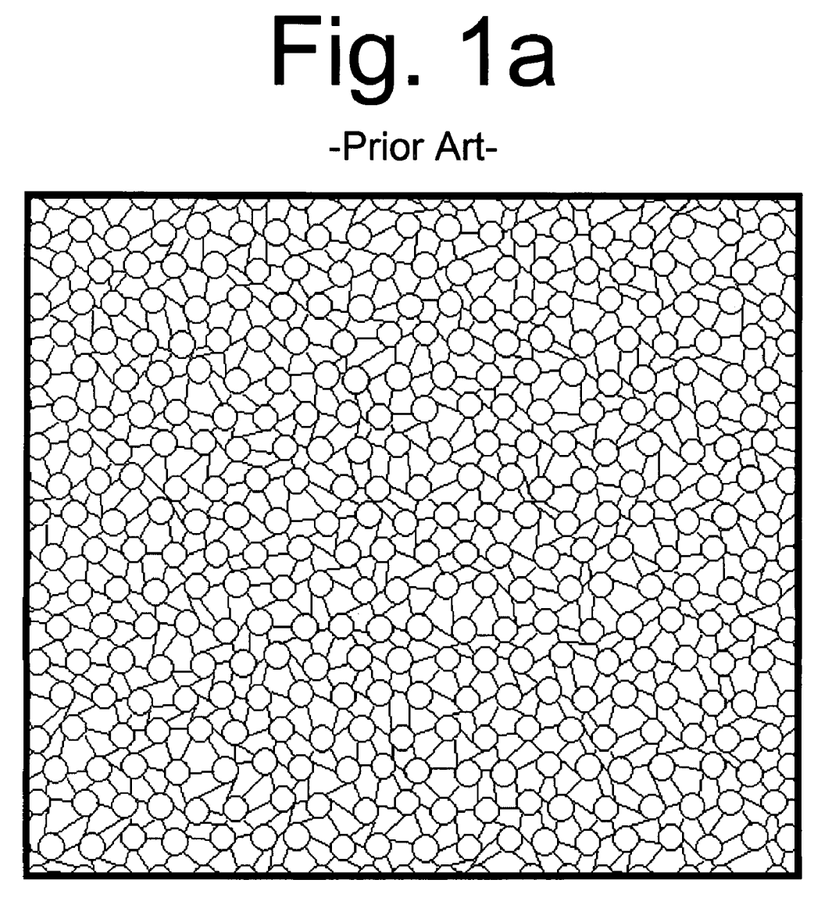
FIG. 1a shows a prior art hub-spoke conductive pattern.

FIG. 1a depicts a prior art hub-spoke metallization pattern on an optical sensor window. As can be seen in the diagram, the entire sensor window is covered with a metallized hub-spoke pattern for EMI shielding.

Figure 1B:
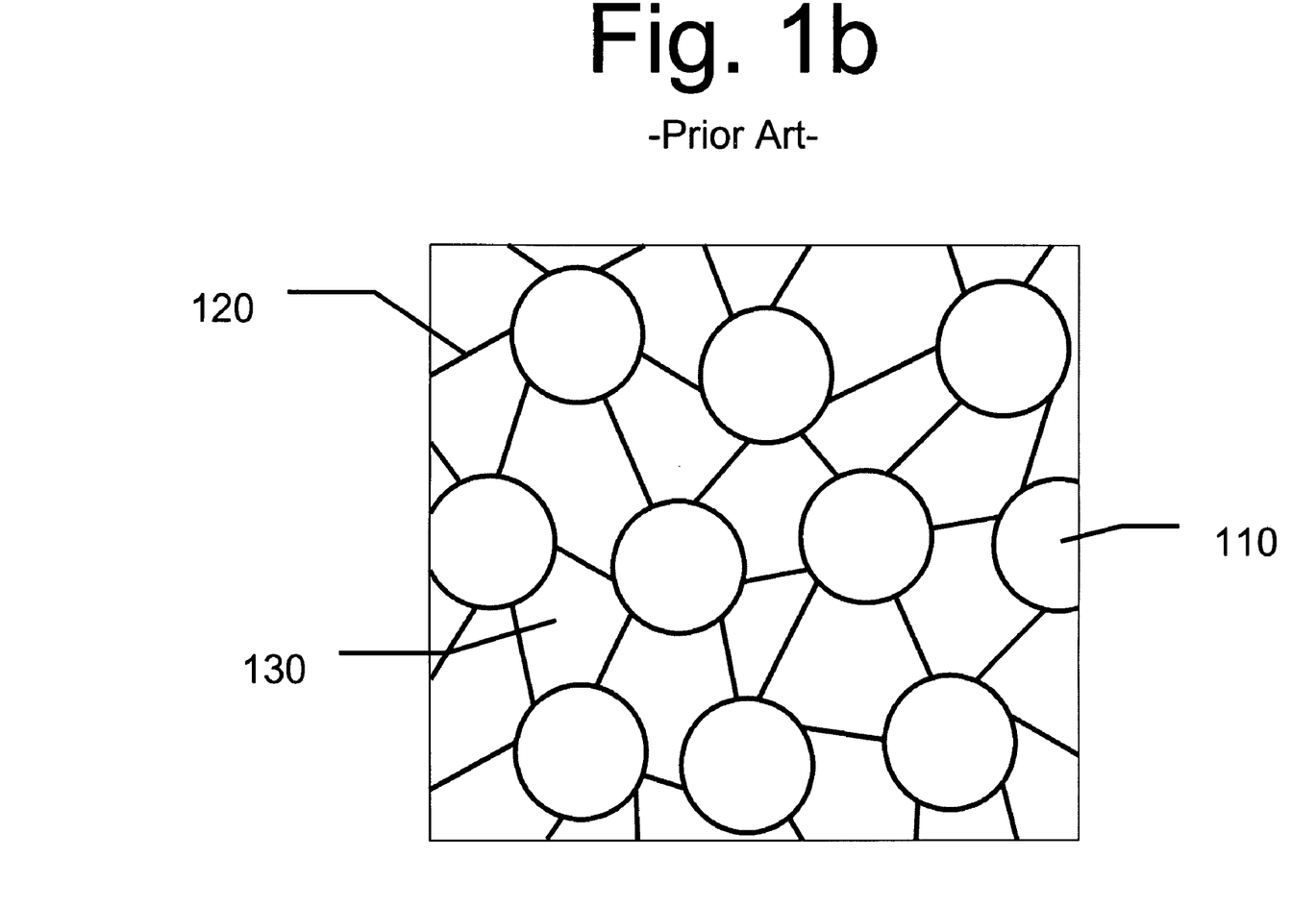
FIG. 1b shows a close-up view of a prior art hub-spoke pattern.

FIG. 1b shows the hub-spoke pattern in more detail. As can be seen, the solid circles, or "hubs" 110 are connected to each-other (and therefore to any eventual ground or dissipation means) by spokes 120. This ensures that there are no electrically isolated metallized circles on the sensor window. The remaining un-metallized portions 130 allow both optical and infra-red radiation to pass through the sensor window.

Through the use of Fourier analysis, it was determined that the spokes in the hub-spoke grid were actually detrimental and should be eliminated, and that the circles could indeed overlap, rather than having to be arranged in tangential, non-overlapping contact with adjacent circles. Elimination of the spokes eliminated all sources of −13 dB side lobe scattering characteristic of straight-line diffraction.

Figure 2:
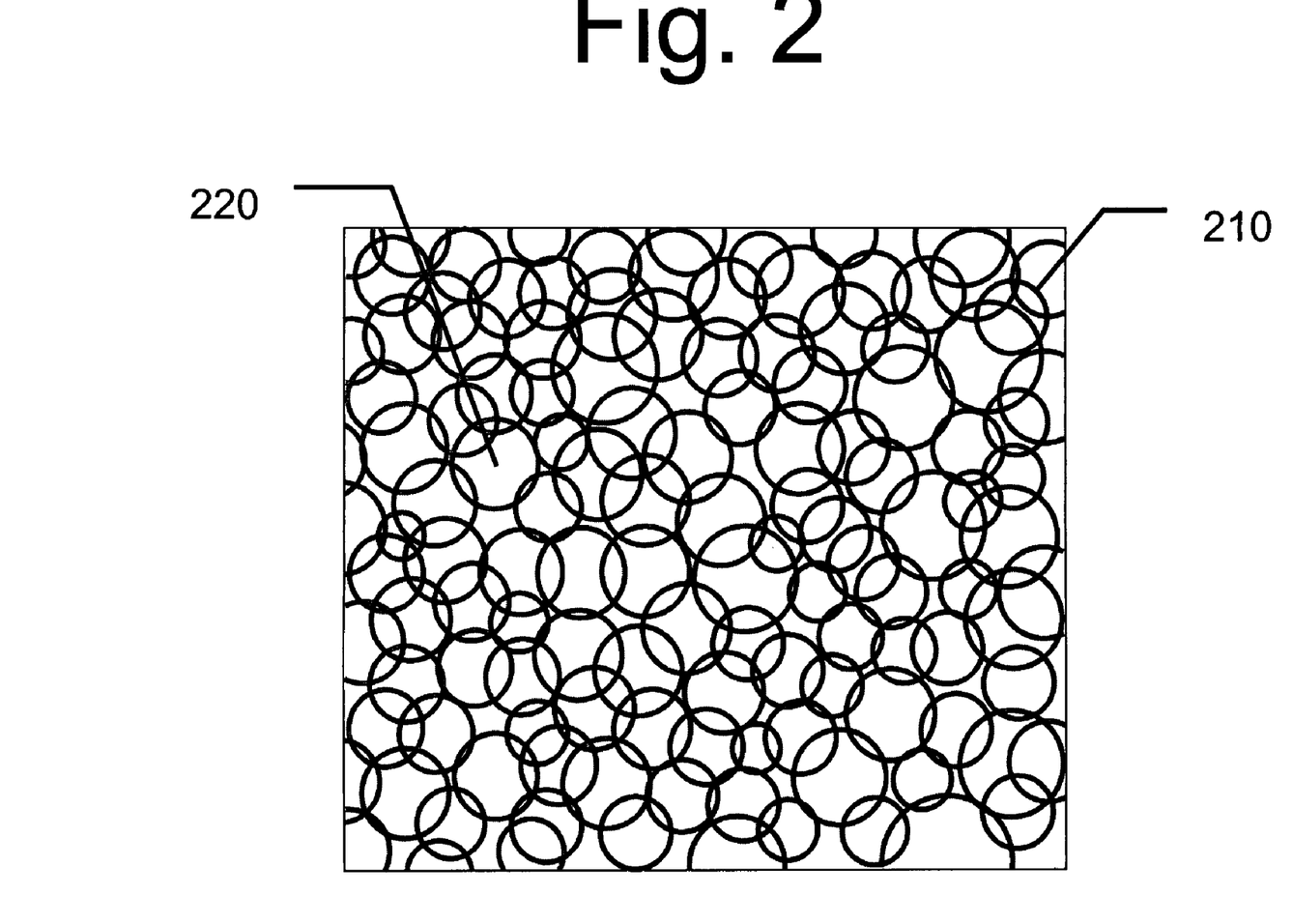
FIG. 2 shows a conductive pattern in a randomized circle grid according to the present invention.

FIG. 2 shows an embodiment of a spoke-free optical sensor window elliptical metallization pattern according to the present invention. The embodiment depicted uses circle shapes. Each circle 210 may be made of an electro-magnetically opaque metal or metallic substance such as gold, aluminum, platinum, various resistive alloys, graphite, or other similar materials. Some embodiments may also employ an appropriate interfacing primer coating to the substrate to increase bonding durability. The optical substrate 220 between the circles is not coated with conductive material. As can be seen from the diagram, the positions of the circle centers are not uniformly spaced, but instead are uniformly randomized over the window aperture. In the embodiment shown, the circles in the pattern are electrically continuous to each other, with no floating "islands" (clumps of circles contiguous to each other but not to the rest of the grid). Embodiments of RF absorptive mesh patterns utilizing RCG meshes that deliberately utilize RF-resonant organization of clumps of either conductive or resistive circle patterns may also be generated according to the present invention.

In the embodiment depicted, the diameters of the circle centers were randomized using a Gaussian randomization over a roughly 3× range (typically 200-600 microns with 400 micron mean diameter). The positions of the circles are preferably randomized to some extent to reduce periodicity in the pattern, thereby reducing potentially detrimental effects of laser diffraction sidelobe reinforcement and contrast reduction in sensor imagery. Other embodiments may use different randomization methods, but embodiments using randomized shape size, orientation and location distribution are generally preferred over embodiments having a discernible, repeating pattern. Some embodiments may use elliptical shapes or combinations of elliptical shapes and circles. Also, an embodiment with a randomized metallization pattern is easier to produce as it requires a lesser degree of precision than one having a regular pattern, such as a pattern where all the circles are uniformly sized and tangent without overlapping.

Figure 3:
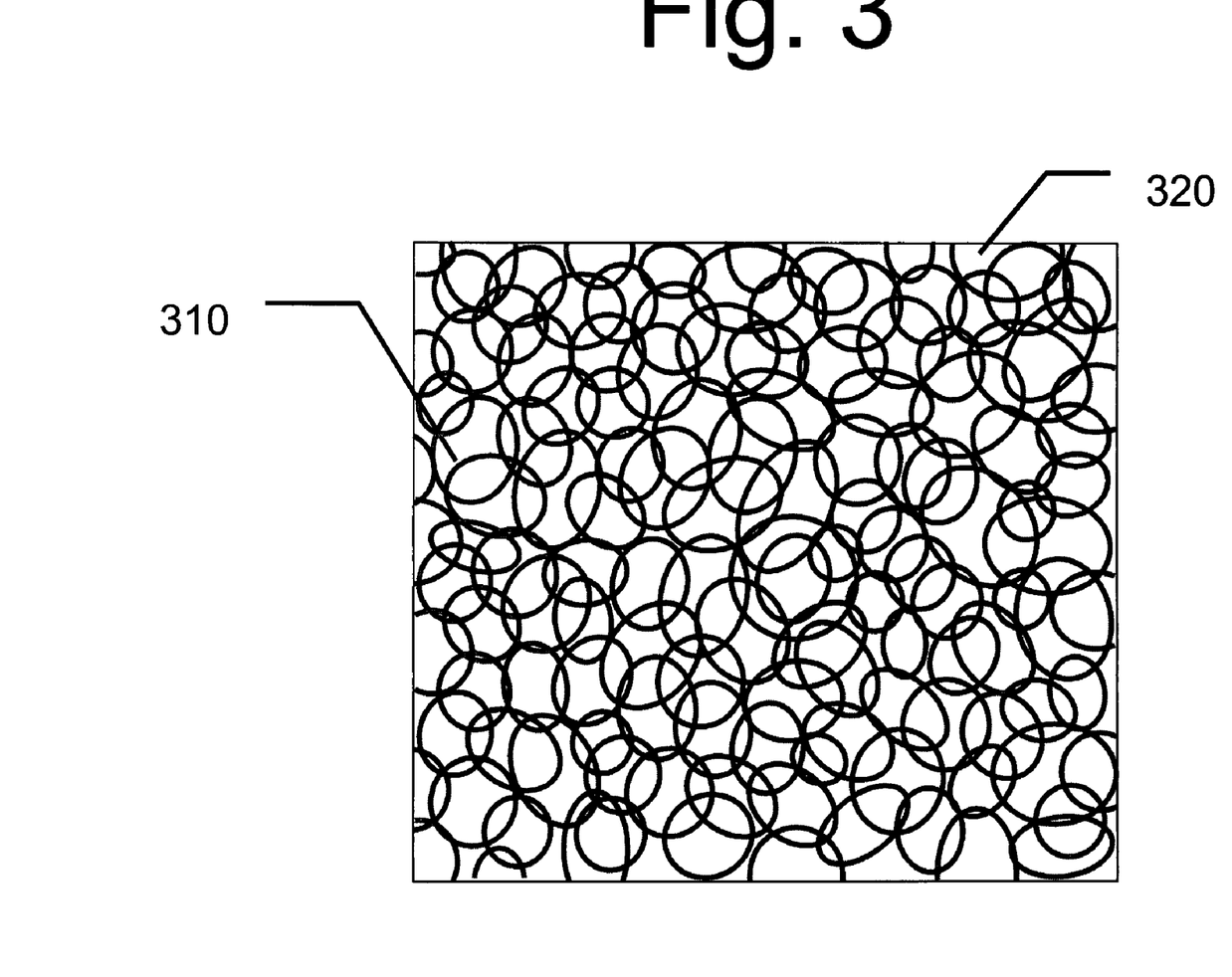
FIG. 3 shows an alternative conductive pattern mixing randomized circles and ellipses according to the present invention.

FIG. 3 shows an embodiment of a spoke-free optical sensor window metallization according to the present invention that employs a randomized elliptical grid metallization pattern. Embodiments of randomization in elliptical grid approaches may include slight randomization of the ratio of minor to major axes and/or changes to the angular orientation of the major axes of the ellipses. Further embodiments may allow for mixed approaches using circles and ellipses.

Embodiments using randomization may further reduce generation of discernable structure in far-field diffraction patterns. In an embodiment of a conductive EMI/EMP mesh, the individual metallized ellipses are preferably electrically continuous to each other, with no floating "islands" (clumps of ellipses contiguous to each other but not to the rest of the grid). Embodiments of RF absorptive mesh patterns utilizing randomized elliptical meshes of either conductive or resistive materials with ellipses arranged in electrically isolated RF-resonant patterns may also be generated according to the present invention. In the embodiment depicted, both the ratio of the minor and major axes as well as the angular orientation of the ellipses 310 may be varied in addition to randomly dispersing them on the sensor window. The clear areas 320 are the un-metallized portions of the sensor window. The ellipses 310 depicted in this embodiment are therefore hollow in order to minimally obscure the passage of electro-optical radiation through the metallized sensor window. In the embodiment depicted, there are preferably no straight lines to generate straight-line diffraction effects, and no readily discernible pattern that may cause consistent or specific diffraction or noise under normal operating conditions.

Embodiments of metallizations similar to those depicted in FIGS. 2 and 3 may be fabricated with 1-2 micron deposition thickness and a nominal 10 micron feature width for the metallization. Fabrication techniques may include etching, plating, lithography, chemical or plasma vapor deposition, sputtering, screen printing, and any other suitable technique for the creation of patterned metallization layers. An embodiment of a metallization pattern according to the present invention may be created using a variety of tools and techniques, including using calculation algorithms based on particular random distributions and/or seed values that may indicate or be predicated on any of: a desired pattern density, overall shape size, extent of variation in shape size, extent of variation in shape orientation, desired average major or minor axis values, level of variation in major or minor axis values, average thickness of a deposited shape, level of variation in shape thickness, and any gradation or change in one or more of the preceding parameters throughout the metallization pattern.

Figure 4:
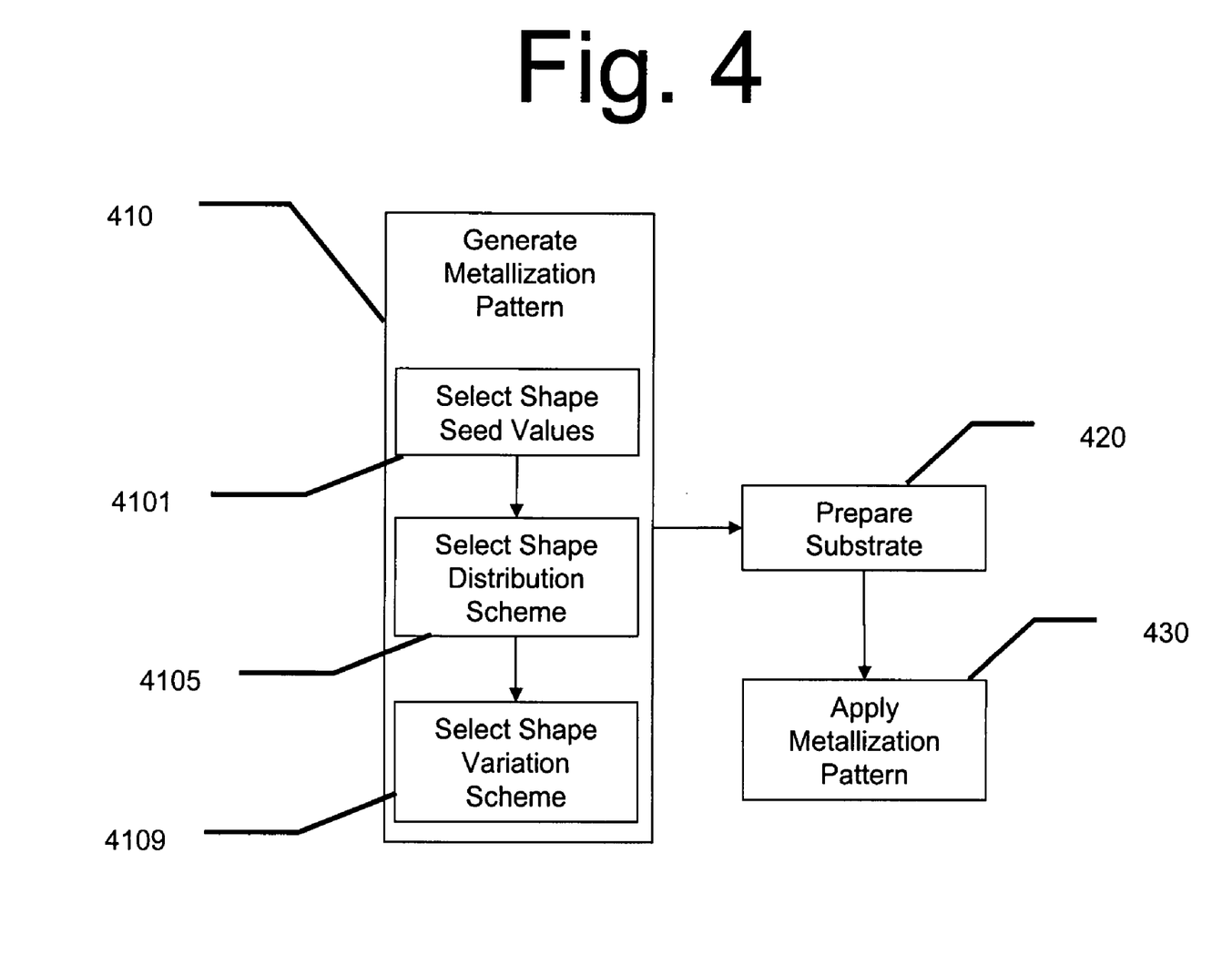
FIG. 4 shows an embodiment of a grid arrangement and creation process according to the present invention.

An embodiment of a pattern generation and fabrication process is depicted in the flowchart on FIG. 4. The metallization pattern generation 410 process may be divided into steps of selecting seed values for shapes 4101, selecting a shape distribution scheme 4105, and selecting a shape variation scheme 4109. Embodiments of seed values for shapes may include ranges or baseline values for the major and minor ellipse axes, ranges or baseline values for ellipse rotation angles, and ranges or baseline values for shape outline thickness. Further embodiments may include a specific "circles only" or "no circles" feature allowing selection of only circle shapes (ellipses having equal major and minor axes) or suppression of the same. Yet further embodiments may include desired average shape size and rotation values with configurable standard deviation sizes or preset probability distribution curves. Yet further embodiments may permit a desired mean or mode associated with one or more seed values. Some further embodiments may replace or supplement seed values or variation ranges with automatically calculated values based on known or expected performance requirements Embodiments of selecting a shape distribution scheme 4105 may include selecting one or more desired baseline or average pattern densities or pattern density ranges. Some embodiments may allow the selection of multiple pattern densities for different local areas of a metallization pattern. Other embodiments may permit the establishment of pattern density gradations and directions such as an increasing or decreasing density value in a particular direction. Embodiments may include selecting a pattern density seed value as a center value in an increasing or decreasing gradation moving across a sensor window or starting from a particular point on the window and radiating outward in two or more directions. Yet further embodiments may have multiple gradations and gradation directions associated with multiple pattern spread directions, such as a pattern originating from a corner of a rectangular window and having increasing density in an x-direction and decreasing density in a y-direction. Yet further embodiments may employ arbitrary origination points or seed points and may employ multiple non-orthogonal spread directions.

Figure 5:
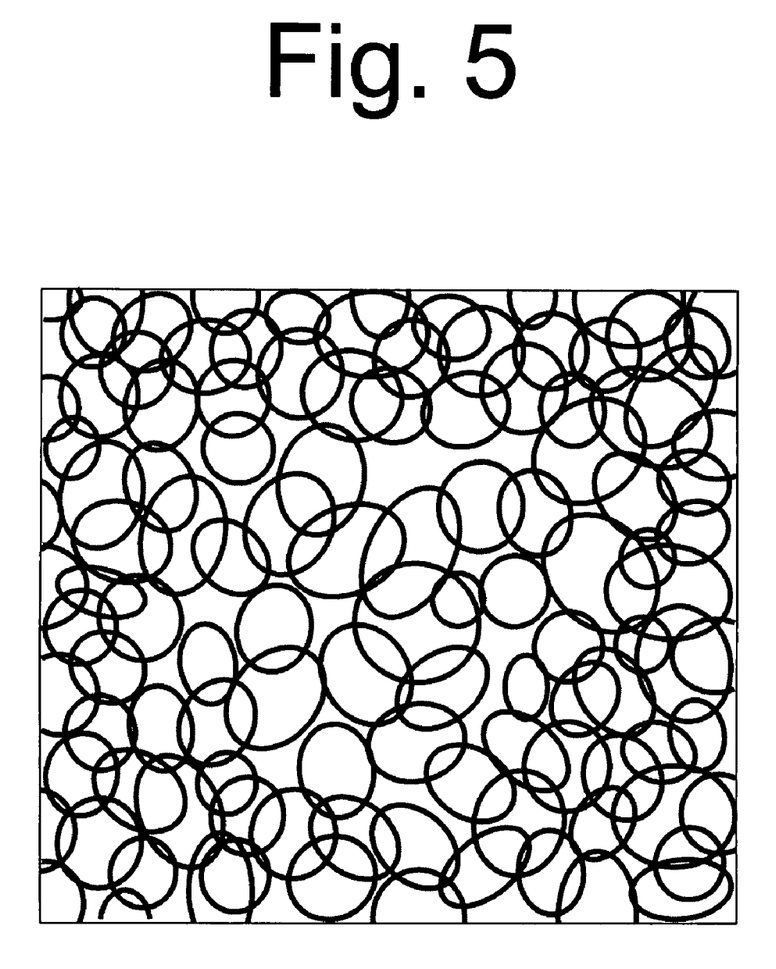
FIG. 5 shows an embodiment of a grid having a non-uniform pattern density.

Some embodiments may replace or supplement seed values with automatically calculated values based on known or expected performance requirements. In some further embodiments, pattern density may be increased toward the edge of an optical substrate aperture to synthesize electrical tapering for better impedance matching to the surrounding support frame. An embodiment having increased pattern density towards the edge of a sensor window is depicted in FIG. 5. Yet further embodiments may include selecting or generating a probability distribution curve based on seed values or automatically calculated values based on performance requirements. Some embodiments may include multiple distribution curves for different local areas of a sensor window. Probability distribution curves may be linear, Gaussian, skewed, logarithmic, or of any other suitable form based on operating requirements and/or design specifications.

Embodiments of selecting a shape variation scheme 4109 may include selecting or generating probability functions associated with the seed values, ranges, or automatically calculated values generated in the selecting seed values 4101 step. As with embodiments of selecting a shape distribution, embodiments of probability curves dictating shape variation types and ranges may be associated with a pattern or local pattern areas and may further have associated gradients dictating changes in variation range across a pattern or local pattern area. Some embodiments of selecting shape variation schemes may also employ differing deposition thicknesses and/or feature widths to spatially vary RF conductivity or absorptivity. Feature widths may include the sizes of major and minor ellipse axes.

In the embodiment shown, after a metallization pattern is generated 410, the substrate receiving the metallization may need to be prepared 420. For embodiments where a substrate is a sensor window, preparation may include various forms of cleaning (chemical cleaning, plasma cleaning, polishing). Some embodiments may include applying light-absorbing or non-reflective coatings to the sensor window substrate. Further embodiments may include plating the entire substrate with the metallization or applying a precursor layer to those portions of the substrate that will eventually be metallized. In some embodiments, the process of substrate preparation may be omitted or included as part of metallization application 430.

In some embodiments, once the substrate is prepared, the metallization pattern may be applied or created 430. For embodiments where a substrate is fully metallized during substrate preparation, embodiments of pattern creation may include application of masks or templates and an etching process to remove the unwanted portions of the metallization. Alternate embodiments may include chemical or plasma deposition, lithography, screen printing, sputtering, or plating onto prepared or masked-out areas. Embodiments having precursor layers may also employ etching to selectively remove portions of a blanket metallization layer and, in some embodiments, portions of underlying layers.

Embodiments using circles produce Bessel function diffraction side lobes beginning at about 17 dB below the main lobe. This is fully 4 dB lower than the $\sin(x)/x$ diffraction side lobes caused by straight-line hub-spoke segments, which have main side lobes 13 dB down from the main lobe. Embodiments using elliptical patterns produce diffraction sidelobes at similar levels, with the sidelobe ellipticity oriented 90 degrees to each pattern ellipse orientation. Gaussian randomization of the circle radii and/or ellipse major and minor axes and major axis orientations about a mean value may, in some embodiments, further smooth and broaden the 17 dB sidelobes, improving the uniformity of the far-field diffraction pattern. Although shapes having straight edges may be employed in some embodiments of randomized grid patterns, the presence of the straight edges in the shapes may lead to increased diffraction. Embodiments using a circular or mixed circular/elliptical grid without straight edges are therefore preferable for their reduced levels of diffraction.

Grid embodiments that reduce or eliminate the spokes of the hub-spoke design realize reductions in scattering and haze. The scattered haze produced by propagation through an embodiment of an RCG pattern may be one-fourth the scattering produced by a traditional straight-line mesh or grid of equal EMI/EMP shielding, and may be several dB lower than the hub-spoke pattern. Specific amounts of scattering and haze reduction may vary based on the particular pattern distribution used in an embodiment. In embodiments where circle centers are uniformly spaced in X and Y, the resulting periodicity may coherently add up in the far field to produce undesirable diffraction side lobes and modulation transfer function effects. In embodiments where the positions of the circles or ellipses are randomized while guaranteeing continuous electrical conductivity, the diffraction side lobes and periodic image structure may be eliminated, allowing for substantially improved broadband optical/IR images for a given conductivity. In some randomized embodiments, circle or ellipse randomization may be accomplished with a uniform probability distribution.

In embodiments seeking to achieve higher conductivity and lower sheet resistance, more random circles and ellipses may be applied, with an attendant reduction in optical/IR transmission. Embodiments seeking to achieve non-uniform conductivity, such as, for example, increasing the conductivity toward the window frame in a gradual taper for better broadband RF impedance matching between an optical window or lens and its surrounding frame, more circles and ellipses may be applied at the periphery of the window or lens than at the center.

Figure 6:
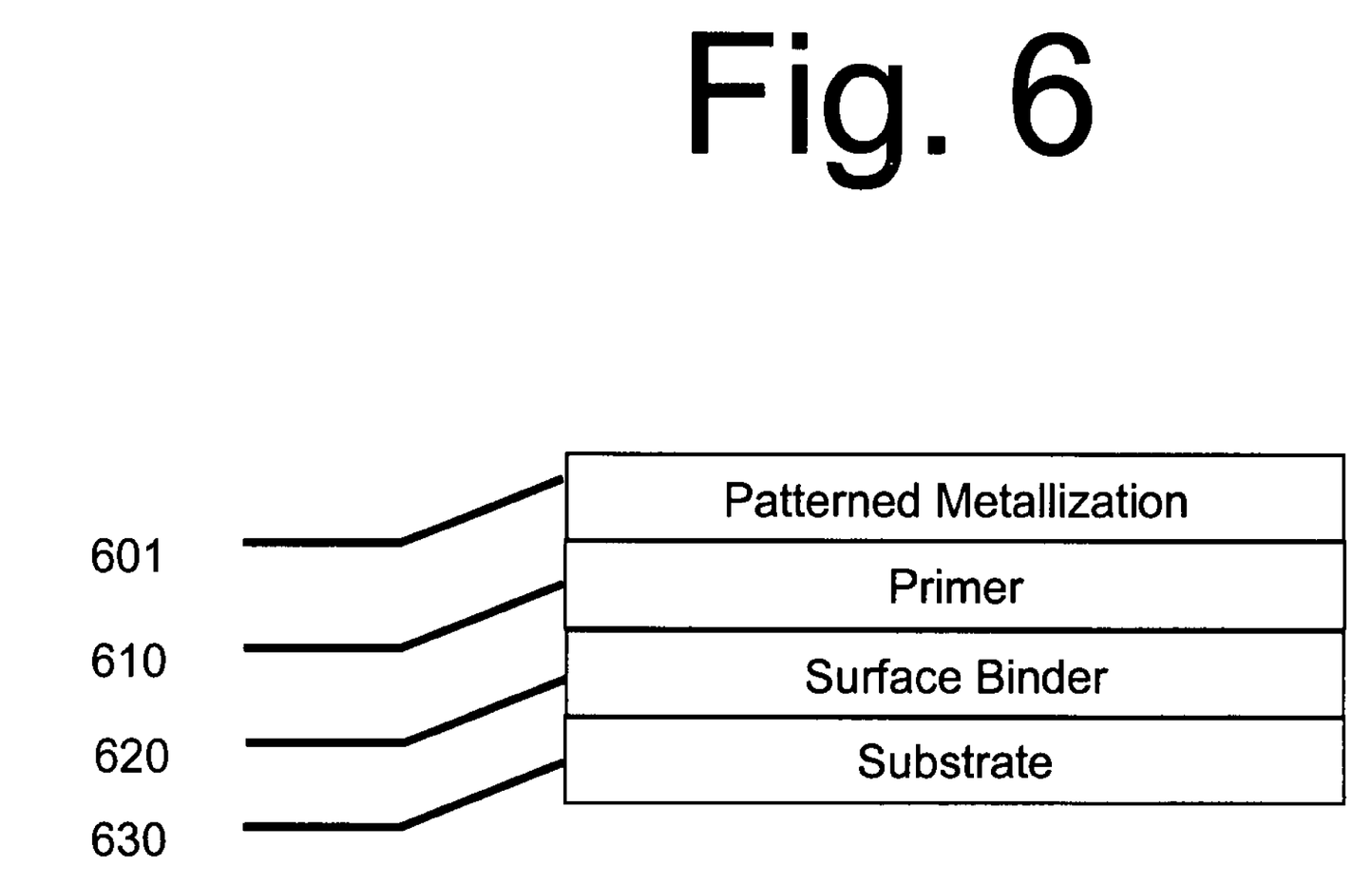
FIG. 6 shows an embodiment of a grid having a multi-layer structure.

For embodiments configured to detect incident laser radiation, such as in a semi-active laser (SAL) seeker device, laser reflections from a randomized circular grid may be greatly reduced by embodiments having multiple layers, beginning with a light-absorbing surface binder directly on the exterior glass surface. An embodiment of such a multi-layered structure is depicted in FIG. 6. In the embodiment shown, a first light-absorbing layer 620 disposed on the exterior glass surface 630 may be followed by a primer layer 610 that promotes better adherence of the conductive or resistive material 601 to the absorbing layer. Embodiments using a thin deposition thickness and randomization of metallized ellipses may exhibit reduced sensitivity to incidence angle, thereby minimizing reflection of incident laser signal. Such measures are especially advantageous in laser-guided munitions applications where signal reflection may reveal the trajectory of a munition (and therefore allow for location or identification of the source of said munition). Reflection of laser radiation may also lead to discrepancies in target tracking on the part of the munition or other, nearby, similarly-guided munitions, so a solution that reduces or eliminates reflection of laser radiation from the surface metallization of an optical sensor window would clearly be advantageous. In some embodiments, the primer 610 as well as the metallization 601 may be patterned. In further embodiments, a light-absorbing binder layer 620 may cover the entire substrate 630 to provide improved light absorption and reduced reflection or glare.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

The invention claimed is:

1. A metallization coating for a sensor window, the coating comprising:
   a plurality of randomly distributed elliptical shapes arranged in a randomized elliptical grid pattern such that the elliptical shapes are physically connected to each-other as a result of direct shape-to-shape contact or overlap;
   where the elliptical shapes are hollow to allow for transmission of electro-optical radiation through the sensor window; and
   where pattern density, which is a ratio of shapes per unit of sensor window area, increases toward an edge of the sensor window.

2. The coating of claim 1, wherein the randomized elliptical grid pattern is made of an electrically conductive material.

3. The coating of claim 1, wherein the randomized elliptical grid pattern is made of an electrically resistive material.

4. The coating of claim 1, where each elliptical shape has a 1-2 micron deposition thickness and the elliptical shapes have an average major axis width of 10 microns.

5. The coating of claim 1, wherein the randomized elliptical grid pattern is radio-frequency (RF) resonant.

6. The coating of claim 1, where rotational orientation of at least one of the elliptical shapes with respect to the sensor window is randomized.

7. The coating of claim 1, where a size of the major and minor axes of at least one of the elliptical shapes is randomized.

8. The coating of claim 7, where at least one the elliptical shapes has major and minor axes of equal size.

9. The coating of claim 8, where the elliptical shapes are circles.

10. The coating of claim 1, where the elliptical shapes are electrically connected.

11. The coating of claim 10, where at least one of the elliptical shapes is electrically connected to a window frame encompassing the sensor window.

12. The coating of claim 10, where each of the elliptical shapes is electrically connected to at least one other elliptical shape.

13. The coating of claim 1, where the elliptical shapes are distributed on the sensor window according to a normal probability distribution.

14. The coating of claim 1, where each of the elliptical shapes is physically connected to at least one other elliptical shape.

15. The coating of claim 1, where the coating is spoke-free.

16. The coating of claim 1, where the grid pattern is a radio-frequency (RF) absorptive randomized elliptical mesh with ellipses arranged in electrically isolated RF-resonant patterns.

17. A metallization coating for a sensor window, the coating comprising:
   a metallization layer including a plurality of randomly distributed elliptical shapes arranged in a randomized elliptical grid pattern such that the elliptical shapes are physically connected to each-other as a result of direct shape-to-shape contact or overlap;
   a light-absorbing surface binder layer; and
   a primer layer, disposed on top of the binder layer, where the primer layer improves adhesion between the metallization layer and the binder layer;
   where the surface binder layer is disposed on the sensor window and the metallization layer is disposed on top of the primer layer; and
   where the elliptical shapes are hollow to allow for transmission of electro-optical radiation through the sensor window.

* * * * *